(12) United States Patent
Doi et al.

(10) Patent No.: US 9,093,198 B2
(45) Date of Patent: Jul. 28, 2015

(54) METHOD OF PRODUCING FERROELECTRIC THIN FILM-FORMING COMPOSITION AND APPLICATION OF THE SAME

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/181,675

(22) Filed: Feb. 16, 2014

(65) Prior Publication Data
US 2014/0288233 A1    Sep. 25, 2014

(30) Foreign Application Priority Data

Mar. 25, 2013 (JP) ................................. 2013-061723

(51) Int. Cl.
| | |
|---|---|
| C08F 222/40 | (2006.01) |
| C08F 24/00 | (2006.01) |
| H01B 3/44 | (2006.01) |
| H01L 41/187 | (2006.01) |
| H01L 41/318 | (2013.01) |
| C23C 18/12 | (2006.01) |

(52) U.S. Cl.
CPC ............ *H01B 3/448* (2013.01); *C23C 18/1283* (2013.01); *H01L 41/1876* (2013.01); *H01L 41/318* (2013.01)

(58) Field of Classification Search
CPC   C23C 18/1216; C23C 18/1254; H01B 3/448; H01L 41/318; H01L 41/1876
USPC .......................................... 524/548; 526/266
See application file for complete search history.

(56) References Cited

FOREIGN PATENT DOCUMENTS

| | | |
|---|---|---|
| JP | 60-236404 A | 11/1985 |
| JP | 2001-261338 A | 9/2001 |

OTHER PUBLICATIONS

Shinsulke Takenaka and Hiromitsu Kozuka, "PVP-assisted sol-gel deposition of single layer ferroelectric thin films over submicron or micron in thickness", Journal of the European Ceramic Society, Elsevier Science Publishers, Barking, Essex, GB, vol. 24, No. 6, Sep. 4, 2003, pp. 1585-1588.*
H. Kozuka et al., "PVP-assisted sol-gel deposition of single layer ferroelectric thin films over submicron or micron in thickness", Journal of the European Ceramic Society, Elsevier Science Publishers, Barking, Essex, GB, vol. 24, No. 6, Sep. 4, 2003, pp. 1585-1588.
Akihiro Yamano et al., "Single-step sol-gel deposition and dielectric properties of 0.4 µm thick, (001) oriented Pb(Zr, Ti)$O_3$ thin films," J Sol-Gel Sci Technol (2008) vol. 47, pp. 316-325.
H. Kozuka et al., "PVP-assisted sol-gel deposition of single layer ferroelectric thin films over submicron or micron in thickness", Journal of the European Ceramic Society, Elsevier Science Publishers, Barking, Essex, GB, vol. 24, Sep. 24, 2003, pp. 1585-1588.
S. Takenaka et al., "Sol-Gel Preparation of Single-Layer, 0.75 µm Thick Lead Zirconate Titanate Films From Lead Nitrate-Titanium and Zirconium Alkoxide Solutions Containing Polyvinylpyrrolidone", Applied Physics Letters, American Institute of Physics, US, vol. 79, No. 21, Nov. 19, 2001, pp. 3485-3487.
H. Kozuka et al., "Crack-Free, Thick Ceramic Coating Films via Non-Repetitive Dip-Coating Using Polyvinylpyrrolidone as Stress-Relaxing Agent", Journal of Sol-Gel Science and Technology, Kluwer Academic Publishers, BO, vol. 19, 2000, pp. 205-209.
H. Guo et al., "Characterization of PZT ferroelectric thin films prepared by a modified sol-gel method", 2008 IEEE International Ultrasonics Symposium, 2008, pp. 2130-2133.
Q. Zhang et al., "Effect of the particle size in PZT precursor sols on the orientation of the thin films", Journal of the European Ceramic Society, vol. 19, 1999, pp. 1417-1421.
Q. Zhang et al., "Studies of Lead Zirconate Titanate Sol Ageing Part I: Factors Affecting Particle Growth", Journal of Sol-Gel Science and Technology, vol. 23, 2002, pp. 135-144.
Z. Huang et al., "Studies of Lead Zirconate Titanate Sol Aging Part II: Particle Growth Mechanisms and Kinetics", Journal of Sol-Gel Science and Technology, vol. 24, 2002, pp. 49-55.
A. Suarez-Gomez et al., "The Effects of aging and concentration on some interesting Sol-gel parameters: A feasibility study for PZT nanoparticles insertion on in-house prepared PAA matrices via electrophoresis", Journal of Electroceramics, vol. 22, 2009, pp. 136-144.
European Search Report dated Jul. 3, 2014, issued for the European patent application No. 14155335.4.

* cited by examiner

*Primary Examiner* — William Cheung
(74) *Attorney, Agent, or Firm* — Locke Lord LLP; James E. Armstrong, IV; Nicholas J. DiCeglie, Jr.

(57) ABSTRACT

A method of preparing a ferroelectric thin film-forming composition, specifically, a method of preparing a PZT thin film-forming composition includes: a step of allowing composition precursor raw materials, which contain PZT precursor substances at a concentration of 23 to 38 mass % in terms of oxides in 100 mass % of the composition precursor raw materials, and a high-molecular compound to react with each other to obtain a PZT thin film-forming composition precursor; and a step of aging the PZT thin film-forming composition precursor at a temperature of 0 to 10° C. for at least 30 days.

8 Claims, No Drawings

METHOD OF PRODUCING FERROELECTRIC THIN FILM-FORMING COMPOSITION AND APPLICATION OF THE SAME

BACKGROUND OF THE INVENTION

1. Field of the Invention

The present invention relates to a method of producing a ferroelectric thin film-forming composition suitable for use in a high-capacity and high-density thin film capacitor or the like; and an application of the same Priority is claimed on Japanese Patent Application No. 2013-061723, filed on Mar. 25, 2013, the content of which is incorporated herein by reference.

2. Description of Related Art

Japanese/Unexamined Patent Application, First publication No. S60-236404 (claim 1, line 14 in the lower left column of page 5 to line 16 in the same column of the same page) discloses a method of forming a ferroelectric thin film material. Specifically, first, one dielectric material-forming precursor selected from lead titanate (PT), lead zirconate titanate (PZT), and the like is dissolved in an organic solvent containing at least one selected from lower alcohols, β-diketones, and the like as a major component to prepare a dielectric material-forming precursor solution. Next, the dielectric material-forming precursor solution is coated on a metal substrate and dried to form a coating film of a dielectric material-forming precursor, and then the coating film is pre-baked in a temperature range from a decomposition temperature of an organic material in the coating film to a crystallization temperature of a dielectric material. Next, the coating, drying and pre-baking processes of the dielectric material-forming precursor solution are repeated, followed by baking at the crystallization temperature or higher of the dielectric material. Alternatively, the coating process of the dielectric material-forming precursor solution on a metal substrate, the drying process, and the baking process of the dielectric material at the crystallization temperature or higher of the dielectric material are repeated. As a result, two or more layers of thin films of lead titanate (PT), lead zirconate titanate (PZT), and the like are formed on the metal substrate, thereby obtaining a ferroelectric thin film material. In the method of forming a ferroelectric thin film material having the above-described configuration, a dielectric material-crystallized thin film having a desired thickness, non-conductivity, and ferroelectricity can be formed on a metal substrate However, when a PZT film having a thickness of 100 nm or greater per layer is formed using this method, there are problems in that cracking occurs and film density is decreased. In order to solve these problems, approaches have been taken in which, for example, a high-molecular compound, an drying control chemical additive (DCCA), crystalline fine powder, or the like is added to a solution to release stress (for example, refer to Japanese Unexamined Patent Application, First Publication No. 2001-261338 (claim 1, paragraphs [0016] to [0024], Table 1) and J Sol-Gel Sci Technol (2008) 47:316 to 325).

SUMMARY OF THE INVENTION

However, in the methods disclosed in Japanese Unexamined Patent Application, First Publication No. 2001-261338 (claim 1, paragraphs [0016] to [0024], Table 1) and J Sol-Gel Sci Technol (2008) 47:316 to 325, there are problems in that a film is not sufficiently densified, cracking is likely to occur, and refractive index characteristics and polarizability are not sufficient. That is, when this thin film is used for a thin film capacitor, cracking is likely to occur, and thus the leakage current is increased. As a result, there is a problem in that the film does not function as an element. In addition, when the refractive index characteristics are insufficient, the film density is low, and there is a problem in that a sufficient dielectric constant is not obtained. In addition, when the polarizability is insufficient, similarly, there is a problem in that a sufficient dielectric constant is not obtained.

An object of the invention is to provide a method of producing a composition for forming a dense and crack-free ferroelectric thin film having superior refractive index characteristics and polarizability.

As a result of thorough investigation, the present inventors found that a composition for forming a crack-free ferroelectric thin film having superior refractive index characteristics and polarizability can be obtained through the following steps including: a step of allowing composition precursor raw materials, which contain PZT precursor substances at a concentration of 23 to 38 mass % in terms of oxides in 100 mass % of the composition precursor raw materials, and a high-molecular compound to react with each other to obtain a PZT thin film-forming composition precursor; and a step of aging the PZT thin film-forming composition precursor at a temperature of 0 to 10° C. for at least 30 days.

According to a first aspect of the invention, there is provided a method of producing a PZT thin film-forming composition, the method including: a step of allowing composition precursor raw materials, which contain PZT precursor substances at a concentration of 23 to 38 mass % in terms of oxides in 100 mass % of the composition precursor raw materials, and a high-molecular compound to react with each other to obtain a PZT thin film-forming composition precursor; and a step of aging the PZT thin film-forming composition precursor at a temperature of 0 to 10° C. for at least 30 days. "Aging the PZT thin film-forming composition precursor for at least 30 days" described herein represents "aging the PZT thin film-forming composition precursor for 30 or more days".

According to a second aspect of the invention, in the method of producing a PZT thin film-forming composition according to the first aspect, the composition precursor raw materials may contain 16 to 56 mass % of a diol with respect to 100 mass % of the composition precursor raw materials According to a third aspect of the invention, in the method of producing a PZT thin film-forming composition according to the first or second aspect, the high-molecular compound may have a pyrrolidone group or a hydroxyl group, and a ratio of the high-molecular compound to 1 mol of the PZT precursor substances is preferably 0.01 to 0.50 mol.

According to a fourth aspect of the invention, there is provided a method of forming a PZT thin film, in which a PZT thin film-forming composition, which is obtained using the method of producing a PZT thin film-forming composition according to any one of the first to third aspects, is used as a raw material.

According to a fifth aspect of the invention, there is provided a method of manufacturing a composite electronic component, the method including: the method according to the fourth aspect, in which the composite electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, a surface acoustic wave element, a transducer, or an LC noise filter element.

In a PZT thin film which is formed of a PZT thin film-forming composition obtained using the method according to the first aspect, the PZT thin film-forming composition precursor is aged at a temperature of 0 to 10° C. As a result, the pyrolytic properties of the precursor substances are improved, the remaining of unreacted materials in the thin film during a film forming process is suppressed, and thus the thin film is dense. Therefore, the thin film is crack-free, and the refractive index and the polarizability are improved.

A PZT thin film, which is formed of a PZT thin film-forming composition obtained using the method according to the second aspect, is formed not only using the PZT thin film-forming composition obtained by aging the PZT thin film-forming composition precursor at a predetermined temperature for at least 30 days but also using the composition precursor raw materials containing an appropriate amount of the diol. With this method, stress generated by film shrinkage is released. Therefore, the thin film is dense, cracking is further suppressed, the refractive index is improved, and the polarizability is improved.

A PZT thin film, which is formed of a PZT thin film-forming composition obtained using the method according to the third aspect, is formed not only using the PZT thin film-forming composition obtained by aging the PZT thin film-forming composition precursor at a predetermined temperature for at least 30 days but also using an appropriate amount of the high-molecular compound having a pyrrolidone group or a hydroxyl group. With this method, the thin film is softened during a film forming process. As a result, even when strong stress is applied to the thin film during the film forming process, the thin film is elastically or plastically deformed, and thus the polarizability is further improved.

With the method according to the fourth aspect, a dense and crack-free PZT thin film having improved refractive index and polarizability can be obtained.

With the method according to the fifth aspect, a composite electronic component containing a dense and crack-free PZT thin film having improved refractive index and polarizability can be obtained.

DETAILED DESCRIPTION OF THE INVENTION

Next, embodiments of the invention will be described. A method of producing a PZT thin film-forming composition according to an embodiment of the invention includes: a step of allowing composition precursor raw materials, which contain PZT precursor substances at a concentration of 23 to 38 mass % in terms of oxides in 100 mass % of the composition precursor raw materials, and a high-molecular compound to react with each other to obtain a PZT thin film-forming composition precursor; and a step of aging the PZT thin film-forming composition precursor at a temperature of 0 to 10° C. for at least 30 days.

In the composite precursor raw materials, when the content of the PZT precursor substances is less than 23 mass %, an aging effect at a low temperature is not exhibited during the formation of a thin film having a thickness of 100 nm or greater per layer. When the content of the PZT precursor substances is greater than 38 mass %, it is difficult to perform uniform coating, striation or the like occurs during the formation of a thin film, a satisfactory film cannot be obtained. In addition, when the aging temperature is lower than 0° C., there is a problem in that a part of the components is solidified and becomes non-reactive. When the aging temperature is higher than 10° C., an undesirable deterioration reaction rapidly progresses, and precipitation occurs in the solution. Further, the aging time is preferably 30 to 90 days and more preferably 30 to 60 days. The technical reason why the effects of the embodiment are obtained by aging is not clear at this moment but is considered to be that, after being aged for at least 30 days, the PZT precursor substances is likely to be thermally decomposed by ligand substitution reaction between precursors. When the aging time is shorter than 30 days, the aging effects are not obtained. When the aging time is longer than 60 days or 90 days, the effects are not increased any more, which is not efficient.

The composition precursor raw materials for obtaining the PZT thin film-forming composition precursor will be described below. The composition precursor raw materials for forming a PZT thin film contain a Pb source, a Zr source, and a Ti source which are the PZT precursor substances. As the Ph source, lead acetate trihydrate, lead acetate anhydride, lead nitrate, or the like can be used. However, lead acetate trihydrate is preferable because a temporal change after synthesis is small. As the Zr source, zirconium tetrabutoxide, zirconium acetylacetonate, or the like can be used. However, zirconium tetrabutoxide is preferable because temporal stability after reaction is high. As the Ti source, titanium tetraisopropoxide, tetrabutyl orthotitanate, or the like can be used. However, titanium tetraisopropoxide is preferable because it is readily available. In addition, an atomic ratio Pb/Zr/Ti in the composition precursor raw materials is preferably 125:60:40 to 125:40:60 because high electrical properties are obtained. The Pb source, the Zr source, and the Ti source which are PZT precursor substances are weighed and are refluxed in a solvent 1 described below, followed by solvent removal. At this time, it is preferable that a stabilizer be added to the product. Next, a solvent 2 described below is added, thereby obtaining composition precursor raw materials.

The Pb source, the Zr source, and the Ti source which are PZT precursor substances are weighed such that the concentration in terms of oxides thereof in 100 mass % of the composition precursor raw materials is 23 to 38 mass % and more preferably 25 to 28 mass %.

The concentration in terms of oxides described herein represents "an amount ration of a metallic oxide with respect to 100 mass % of the composition precursor raw materials" when all metallic elements in the composition precursor raw materials supposed to be changed into oxide.

As the solvent 1, propylene glycol, ethylene glycol, or the like can be used. However, propylene glycol is preferable because it has an appropriate viscosity. Among the stabilizers, acetyl acetone is preferable from the viewpoints of a high stabilization effect.

In addition, in order to stabilize the PET precursor substances and impart an appropriate viscosity to the obtained solution, the content of the diol is preferably 16 to 56 mass % and more preferably 30 to 45 mass % with respect to 100 mass % of the composition precursor raw materials.

As the solvent 2, ethanol, 1-butanol, 1-octanol, or the like can be used. However, it is preferable that propylene glycol and ethanol be added in this order because aging can be made to slowly progress by allowing propylene glycol and the metal sources to react with each other in advance.

A high-molecular compound is added to the obtained composition precursor raw materials. The reason for adding the high-molecular compound is that tensile stress generated during film formation is decreased, and cracking is suppressed. As the high-molecular compound, a high-molecular compound having a pyrrolidone group, a high-molecular compound having a hydroxyl group, or a high-molecular compound having an acetyl group can be used. However, a high-molecular compound having a pyrrolidone group or a hydroxyl group is preferable because the affinity to the composition precursor raw materials is high, and precipitation is suppressed. Further, the ratio of the high-molecular compound to 1 mol of the PZT precursor substances is more preferably 0.01 to 0.50 mol because cracking can be suppressed without voids in the film. As the high-molecular compound having a pyrrolidone group or a hydroxyl group, polyvinyl pyrrolidone, polyethylene glycol, or the like can be used. However, polyvinyl pyrrolidone is preferable because an effect of suppressing cracking is high.

After obtaining the PZT thin film-forming composition precursor by the reaction between the composition precursor raw materials and the high-molecular compound, the PZT thin film-forming composition precursor is aged at a temperature of 0 to 10° C. for at least 30 days, thereby obtaining a PZT thin film-forming composition. The method according to this embodiment includes the above-described steps.

A method of forming a ferroelectric thin film using the ferroelectric thin film-forming composition produced as above will be described. First, the ferroelectric thin film-forming composition is coated on a substrate to form a coating film thereon (coating process). Examples of a method of coating the composition on the substrate include spin coating.

Next, the coating film formed on the substrate is heated to be dried in a predetermined atmosphere at a temperature lower than a crystallization temperature of the coating film, that is, is pre-baked (drying process). Further, during or after the drying process, the coating film is baked by being held in a predetermined atmosphere at the crystallization temperature or higher of the coating film, that is main-baked (baking process). In order to form the coating film having a large thickness, it is preferable that the coating process and the drying process be repeated multiple times (repeating process) During r after the final drying process in the repeating process, the coating film is baked at the crystallization temperature or higher (baking process). As a result, a ferroelectric thin film having a large thickness of about 50 to 1000 nm can be formed.

The ferroelectric thin film formed as above is dense and thus crack-free and has superior refractive index characteristics and polarizability. In addition, the ferroelectric thin film can be used as a constituent material of a composite electronic component such as a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, a surface acoustic wave element, a transducer, or an LC noise filter element.

EXAMPLES

Next, Examples of the embodiments and Comparative Examples will be described in detail.

Example 1

Lead acetate trihydrate, titanium tetraisopropoxide, and zirconium tetrabutoxide were weighed such that a composition ratio Pb/Zr/Ti was 125/52/48, followed by reflux in propylene glycol. After removing the solvent, acetyl acetone was added. Propylene glycol was added to the product to be diluted such that the concentration thereof in terms of oxides was 35 mass %. Further, the product was diluted to 25 mass % with an ethanol solution to obtain PZT precursor substances. Polyvinyl pyrrolidone was added to the PZT precursor substances such that a molar ratio PZT:polyvinyl pyrrolidone (k=30) was 1:0.125, followed by stirring at room temperature for 24 hours. The obtained solution was aged in a refrigerator at 5° C. for 30 days, and n-ethyl formamide was added to improve the coating properties, followed by stirring for 1 hour. The obtained solution was dripped on a a $Si/SiO_2/TiO_2/Pt$ substrate which was set on a spin coater, followed by spin-coating at a rotating speed of 2500 rpm for 60 seconds. The obtained gel film was heated on a hot plate at 75° C. for 1 minute to remove a low-boiling-point solvent or adsorbed water molecules, followed by pre-baking on a hot plate at 300° C. for 5 minutes. This process was repeated once more, followed by pre-baking and baking using rapid thermal annealing (RTA). The gel film was pre-baked by being heated to 450° C. at 30° C./sec and held at this temperature for 3 minutes. After pre-baking, the gel film was baked by being heated to 700° C. at 30° C./sec and held at this temperature for 1 minute. As a result a PZT thin film was formed.

Examples 2 to 16 and Comparative Examples to 4

PZT thin films of Examples 2 to 16 and Comparative Examples 1 to 4 were formed with the same method as Example 1, except that the concentration of the precursor substances, the diol amount, the molar ratio of PVP, the holding temperature, and the aging time were changed as shown in Table 1.

Comparative Test:

The PZT thin films obtained in Examples 1 to 16 and Comparative Examples to 4 were evaluated using a scanning electron microscope (SEM), a spectroscopic ellipsometer, and electrical properties (P-V characteristics). Whether or not cracking occurred was measured using an optical microscope. The refractive index at 632.8 nm was measured with a method using a spectroscopic ellipsometer (M-2000, manufactured by J.A. Woollam Co. Inc.). The polarization quantity was measured using an impedance analyzer after forming a Pt electrode on a sample of the produced PZT thin film. The results are shown in Table 1.

TABLE 1

| | Composition Preparation Conditions | | | | | Evaluation | | |
|---|---|---|---|---|---|---|---|---|
| | Concentration of Precursor Substances (mass %) | Amount of Diol Added (mass %) | PVP Added (mol) | Holding Temperature (° C.) | Aging Time (Day) | Cracking | Refractive Index | Polarization Quantity ($\mu C/cm^2$) |
| Ex. 1 | 25 | 0 | 0.125 | 5 | 30 | None | 2.48 | 18 |
| Ex. 2 | 23 | 35 | 0.075 | 5 | 30 | None | 2.51 | 20 |
| Ex. 3 | 30 | 35 | 0.075 | 5 | 30 | None | 2.52 | 21 |
| Ex. 4 | 38 | 35 | 0.075 | 5 | 30 | None | 2.51 | 21 |
| Ex. 5 | 25 | 16 | 0.075 | 5 | 30 | None | 2.51 | 21 |

TABLE 1-continued

| | Composition Preparation Conditions | | | | Evaluation | | |
|---|---|---|---|---|---|---|---|
| | Concentration of Precursor Substances (mass %) | Amount of Diol Added (mass %) | Amount of PVP Added (mol) | Holding Temperature (° C.) | Aging Time (Day) | Cracking | Refractive Index | Polarization Quantity ($\mu C/cm^2$) |
| Ex. 6 | 25 | 38 | 0.075 | 5 | 30 | None | 2.51 | 20 |
| Ex. 7 | 25 | 35 | 0.01 | 5 | 30 | None | 2.51 | 20 |
| Ex. 8 | 25 | 35 | 0.075 | 5 | 30 | None | 2.51 | 20 |
| Ex. 9 | 25 | 35 | 0.025 | 5 | 30 | None | 2.51 | 21 |
| Ex. 10 | 25 | 35 | 0.05 | 5 | 30 | None | 2.51 | 21 |
| Ex. 11 | 25 | 35 | 0.075 | 0 | 30 | None | 2.51 | 20 |
| Ex. 12 | 25 | 35 | 0.075 | 10 | 30 | None | 2.51 | 19 |
| Ex. 13 | 25 | 35 | 0.075 | 5 | 60 | None | 2.51 | 21 |
| Ex. 14 | 25 | 35 | 0.075 | 5 | 90 | None | 2.51 | 21 |
| Comp. Ex. 1 | 15 | 35 | 0.075 | 5 | 30 | None | 2.36 | 14 |
| Comp. Ex. 2 | 40 | 35 | 0.075 | 5 | 30 | Occurred | 2.45 | 16 |
| Ex. 15 | 25 | 0 | 0.075 | 5 | 30 | None | 2.47 | 18 |
| Comp. Ex. 3 | 25 | 42 | 0.075 | 5 | 0 | None | 2.40 | 13 |
| Comp. Ex. 4 | 25 | 38 | 0.0075 | 5 | 20 | None | 2.43 | 15 |
| Ex. 16 | 25 | 38 | 0.4 | 5 | 30 | None | 2.48 | 18 |

Evaluation:

As clearly seen in Table 1, the following results were obtained. The non-aged films were porous and had a small polarization quantity. However, in the PZT thin films aged under the conditions of Examples 1 to 16, organic materials were appropriately removed, a dense and crack-free columnar structure was obtained, the refractive index was superior at 2.47 or higher, the residual polarization quantity is large at 18 to 21 $\mu C/cm^2$, and ferroelectric properties were superior. On the other hand, in Comparative Examples 1 to 4, the refractive index and the residual polarization quantity were small, and cracking occurred in a film having a large residual polarization quantity. It was found from the above results that a dense and crack-free PZT thin film having superior refractive index characteristics and polarizability can be obtain d through the following steps including: a step of allowing composition precursor raw materials, which contain PZT precursor substances at a concentration of 23 to 38 mass % in terms of oxides in 100 mass % of the composition precursor raw materials, and a high-molecular compound to react with each other to obtain a PZT thin film-forming composition precursor; and a step of aging the PZT thin film-forming composition precursor at a temperature of 0 to 10° C. for at least 30 days. Further, it was found that, by adding a diol and PVP in appropriate amounts, a PZT film having far superior refractive index characteristics and polarizability can be obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

A thin film, which is formed of a composition produced using the method of producing a ferroelectric thin film-forming composition according to the invention, is crack-free and has superior refractive index and polarizability. In addition, the thin film can be used for a composite electronic component such as a thin film capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, a surface acoustic wave element, a transducer, or an LC noise filter element.

What is claimed is:

1. A method of producing a PZT thin film-forming composition, the method comprising:
   a step of allowing composition precursor raw materials, which contain PZT precursor substances at a concentration of 23 to 38 mass % in terms of oxides in 100 mass % of the composition precursor raw materials, and a high-molecular compound to react with each other to obtain a PZT thin film-forming composition precursor; and
   a step of aging the PZT thin film-forming composition precursor at a temperature of 0 to 10° C. for at least 30 days.

2. The method of producing a PZT thin film-forming composition according to claim 1,
   wherein the composition precursor raw materials contain 16 to 56 mass % of a diol with respect to 100 mass % of the composition precursor raw materials.

3. The method of producing a PZT thin film-forming composition according to claim 1,
   wherein the high-molecular compound has a pyrrolidone group or a hydroxyl group, and
   a ratio of the high-molecular compound to 1 mol of the PZT precursor substances is 0.01 to 0.50 mol.

4. A method of forming a PZT thin film,
   wherein a PZT thin film-forming composition, which is obtained using the method of producing a PZT thin film-forming composition according to claim 1, is used as a raw material.

5. The method of producing a PZT thin film-forming composition according to claim 2,
   wherein the high-molecular compound has a pyrrolidone group or a hydroxyl group, and
   a ratio of the high-molecular compound to 1 mol of the PZT precursor substances is 0.01 to 0.50 mol.

6. A method of forming a PZT thin film,
wherein a PZT thin film-forming composition, which is obtained using the method of producing a PZT thin film-forming composition according to claim 2, is used as a raw material.

7. A method of forming a PZT thin film,
wherein a PZT thin film-forming composition, which is obtained using the method of producing a PZT thin film-forming composition according to claim 3, is used as a raw material.

8. A method of forming a PZT thin film,
wherein a PZT thin film-forming composition, which is obtained using the method of producing a PZT thin film-forming composition according to claim 5, is used as a raw material.

* * * * *